United States Patent [19]
Karlovich et al.

[11] Patent Number: 5,226,824
[45] Date of Patent: Jul. 13, 1993

[54] IC SOCKET AND CONTACT THEREIN

[75] Inventors: Robert Karlovich, Los Gatos; Heng Ching, Fremont, both of Calif.

[73] Assignee: Foxconn International, Inc., Sunnyvale, Calif.

[21] Appl. No.: 882,267

[22] Filed: May 13, 1992

[51] Int. Cl.⁵ .............................................. H01R 9/09
[52] U.S. Cl. ........................................ 439/70; 439/331
[58] Field of Search ...................... 439/70, 72, 76, 80, 439/81, 83, 330, 331, 525, 526

[56] References Cited

U.S. PATENT DOCUMENTS 4,341,433  7/1982  Cherian et al. ...................... 439/331

Primary Examiner—Paula A. Bradley

[57] ABSTRACT

A chip carrier socket (2) for use with an integrated circuit chip carrier (80). The chip carrier (80) has spaced apart contact leads (82) which extend from respective side walls of the chip carrier (80). The socket (2) has a recess (20) for reception of the chip carrier (80) therein. Contact receiving slots (34) are positioned in surrounding relationship to the recess (20) and have contacts (5) disposed therein. Each contact (5) has a generally S-shaped contacting section (52) which cooperates with the corresponding lead (82) of the chip carrier (80), and a mounting section (54) which cooperates with a circuit board on which the socket is seated. A retention section (62) extends upward from an outer end of the mounting section (54) for fastening the contacting section (52) to the socket (2). A reference section (66) laterally extends outward from the lower portion of the retention section (62) to the outside for functioning as a stopper for positioning of the contact or as a testing portion for contacting a probe which is used to collect the data for checking the status of the contact (5).

17 Claims, 6 Drawing Sheets

IC SOCKET AND CONTACT THEREIN

BACKGROUND OF THE INVENTION

1. Field of The Invention

The invention relates to a chip carrier socket for use with chip carriers which have leads thereon. The invention is particularly concerned with providing a low profile chip carrier socket where adequate contact forces of the contacts are achieved against leads on a chip carrier in the socket. The contact force is to be sufficient to compensate for the dimensional variations in the chip carrier as a result of manufacturing tolerances or designated specifications.

2. The Prior Art

Integrated circuits are commonly mounted in chip carriers which are bodies of insulating material having side surfaces from which conductors extend to form the integrated circuits. Traditionally, leads are provided on the side surfaces of the chip carrier body and contact is made with these leads to connect the integrated circuit to conductors on a substrate such as a ceramic substrate or a circuit board. Contact is usually established with the leads on the chip carrier by means of a chip carrier socket which comprises a socket body having in the center portion a recess which receives the chip carrier and has the contacts of the socket in surrounding relationship to the recess so that when the chip carrier is placed in the recess, the contacts of the socket contact the leads of the chip carrier.

Notwithstanding the relatively small size of the chip carrier socket and the contacts in the socket due to miniaturization trend, it is necessary that each contact be capable of exerting a substantial contact force on a respective lead of a chip carrier in order to establish good electrical contact between the contacts and leads on the chip carrier.

Another trend for electrical assembly packaging industry is Surface Mount Technology (SMT). Although traditional chip carrier sockets were mounted on a circuit board with the through-board contact tails by wave soldering process, it is preferred now that the sockets are designed to be surface mounted by using solder pastes printed on the board and in a later time heated through vapor phase process or infrared soldering process so the chip carrier socket is connected to the board by these reflow solder pastes.

For pursuing a better contact force, most manufacturers made a great effort in contact design in order to obtain a resilient contact having a zero insertion or low insertion force but having sufficient retention or contact force with the corresponding lead on the chip carrier, for example, U.S. Pat. Nos. 5,067,904, 5,009,609, 4,968,259, 4,941,832, 4,993,955, 4,872,845, 4,936,783, 4,547,031, 4,846,403, 4,886,470, 4,761,140, 4,919,623, 4,746,299, 4,984,991, 4,684,184, 4,846,704, 4,679,871, 4,691,975, and 4,547,031 . . . .

Generally speaking, the contact is designed to have a sufficiently free length at best so that the contact can own a good resilience when it engages the corresponding lead. In contrast, low profile is a trend in computer industry so it means less space and length can be used to house the contact therein. Accordingly, it is impossible to have the contact have a significant length in a vertical direction. As aforementioned, another trend is surface mount instead of wave soldering. In other words, there is no longer a downward extending tail to be adapted to be received within and through a hole of a board, so that the height of an SMT contact is less than that of a conventional contact having a extending tail. Therefore, based on limited dimension to be utilized, it is more difficult to design a SMT contact having sufficient resilience than a conventional wave soldering or through-hole contact.

Using a forming type contact is a effort which has been made. Forming is a manufacturing method whereby a sheet is cut into pieces as raw components. Each piece is lengthwise bent successively to form a continuous curve in a lateral direction as shown in U.S. Pats. Nos. 4,547,031, 4,679,871 and 4,761,140. The benefit of forming is that the final formed component has a better spring character because bending or forming has in part destroyed the inner structure of the corresponding component so that the stiffness about the bending portion is decreased and more flexibility occurs thereabout. While forming can offer a better spring character, disadvantageously forming is a complex and multiple process and it costs money and takes time. Also, there is manufacturing variations in these successively bending or forming process so it is not easy to control the final product having the designated shape and position, and owning the designated spring character. Additionally, because of tooling limitation, it is impossible to design a sharp angle or a tiny embossment on the surface of the contact during forming. This prohibits some optimal options in design and limits applicable space. Besides, a larger width of the forming component is generally required to ease forming to avoid tilting. In other words it is impossible to arrange a plurality of side by side contacts having a fine pitch within a socket, and no high density contact arrangement can be achieved. Another disadvantage of the forming contact is that because the contact is formed and bent by a single piece, it is difficult to make a protrusion portion which can extend to the outer surface of the socket wall for probe testing when the socket has been mounted on a board and some contact status is required to be a reference. In brief, forming is not a economic and simple method, and easily has variations.

In contrast, using a stamped contact is more popular now. In general, stamping is a easy way to produce the contact. Also, it is easy to control the position and dimension of the product, so no adjustment is required after stamping. Additionally, there is hardly any limitation for stamping to design a sharp angle or a tiny embossment on the surface of the product. Accordingly, the designer can almost utilize the whole space of the contact to achieve a best spring character thereof. Besides, it is unnecessary to use a thicker sheet to form the contact so that it saves the material, and fine pitch and high density contact arrangement can be more easily obtained than by formed contacts.

Although stamping has so many advantages, it still has a big problem for its stiffness. Unlike forming or bending which has damaged a portion of inner combination structure around the bending portion, any part of the stamped contact has the same property as the original sheet. In other words, the spring character is only provided by the shape itself, not by additional pre-bending operation. It is much tougher than the formed contact.

Because there are limitations of low profile and surface mount issues, to design a stamped contact used in those conditions gets more difficult than usual. Some effort has been made in U.S. Pat. No. 4,941,832 which uses stamped contacts in an SMT condition and tries to still achieve the sufficient resilient retention force. The means to operate the function in '832 is to use a mounting arm 32 which is bent inward to accommodate SMT type connection. Although it may achieve the resilience it wants, it still needs at least two-step bending process to form the final shape. Accordingly, there is still some applicable limitations for that contact when it is designed.

In according with this invention, a new design of contact has advantages over aforementioned prior art design. The present invention is specially directed to the specific shape of the contact which allows the contact to have a less height accommodating the low profile socket but still offering a sufficient resilient force to retain the corresponding lead of a chip carrier. Additionally, the contact is formed only by stamping to simplify the manufacturing process for lowering the cost, and also high density and fine pitch contact arrangement can be considerably designed when required. The contact of the present invention also has a benefit for easily using a probe to check the contact status after the socket has been mounted on the board.

SUMMARY OF THE INVENTION

In accordance with one aspect thereof, the invention is directed to a chip carrier socket for use with an integrated circuit chip carrier. The chip carrier has spaced apart contact leads which extend from respective side walls of the chip carrier. The chip carrier socket has a recess for reception of the chip carrier therein. Contact receiving slots are positioned in surrounding relationship to the recess and have contacts disposed therein.

Each contact has a generally S-shaped contacting section which cooperates with the corresponding lead of the chip carrier and a mounting section which cooperates with a circuit board on which the socket is seated. A retention section extends upward from an outer end of the mounting section for fastening the contact to the socket. A reference section laterally extends outward from the lower portion of the retention section to the outside for acting as a stopper for positioning of the contact or as a testing portion for contacting a probe which is applied to collect the data for checking the status of the contact.

The S-shaped section comprises a generally vertical upside-down U-shaped upper portion of which an inner leg engages the corresponding lead of the chip carrier, and a lying generally V-shaped lower portion of which an lower leg is connected to the lower portion of the retention section. According to the foregoing structure, the contact can be positioned in the low profile chip carrier socket but still provide a desirable resilient force when it engages the corresponding lead of the chip carrier which is positioned in the central recess of the socket.

DETAILED DESCRIPTION OF THE INVENTION

Reference will now be made in detail to the preferred embodiment of the invention. While the present invention has been described with reference to the specific embodiment, the description is illustrative of the invention and is not to be construed as limiting the invention. Various modifications to the present invention can be made to the preferred embodiment by those skilled in the art without departing from the true spirit and scope of the invention as defined by the appended claims.

Figure 1:
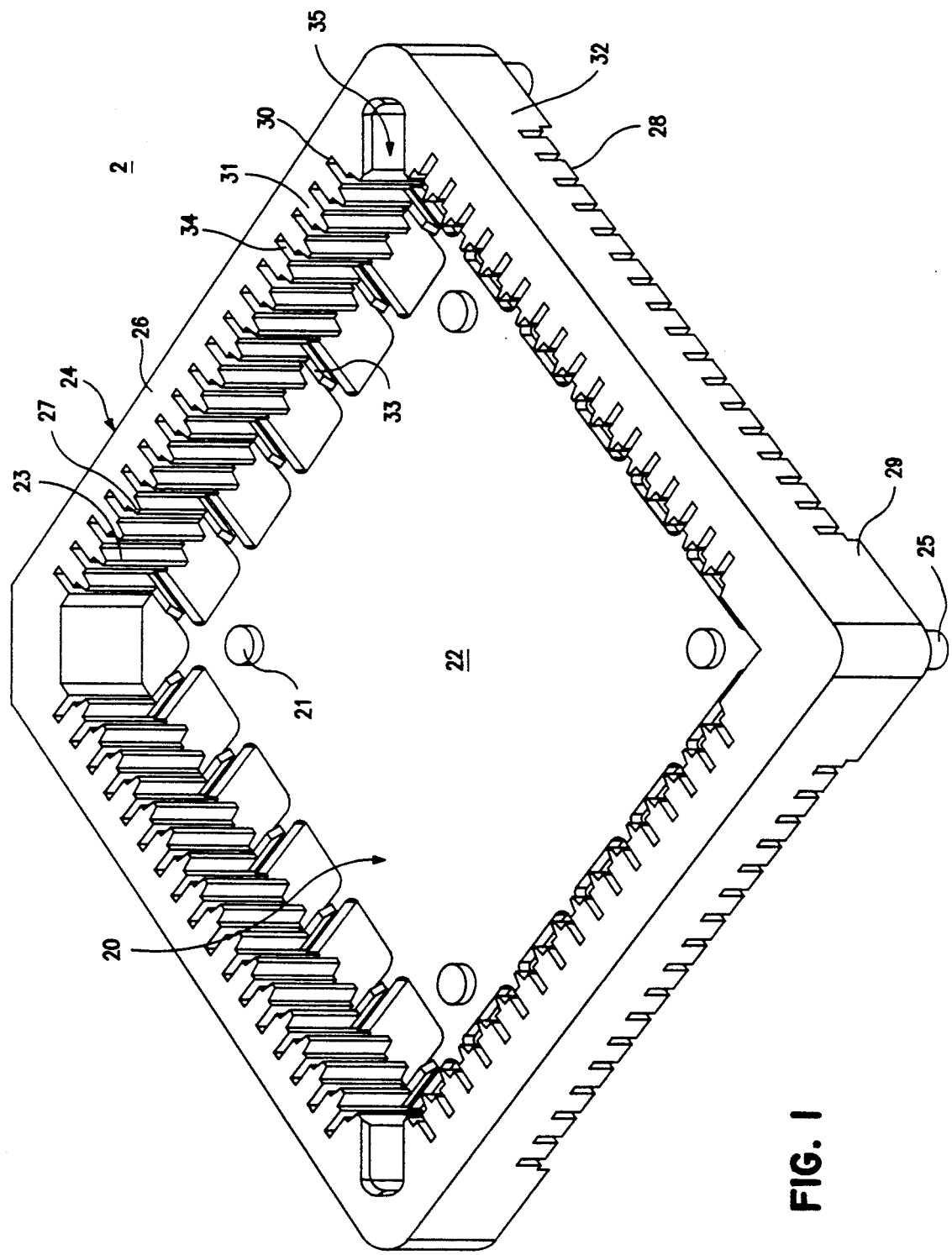
FIG. 1 is a top perspective view of a chip carrier socket of the present invention without the contacts.

With reference first to FIG. 1, the socket 2 of the instant invention includes a square base 22 having walls 24 circumferentially extending normally therefrom and a recess 20 formed thereof. Each wall 24 defines a top surface 26, a bottom surface 28, an inner surface 30 and an outer surface 32. A plurality of side by side partitions 31 extending between and through the top surface 26 and the bottom surface 28, are positioned on each inner surface 30. Therefore, a slot 34 is formed among every two adjacent partitions and the inner surface therebetween to receive a plurality of corresponding contact therein. Each slot 34 also extends through a lower portion of the outer surface 32 for easy access by a probe.

Figure 2:
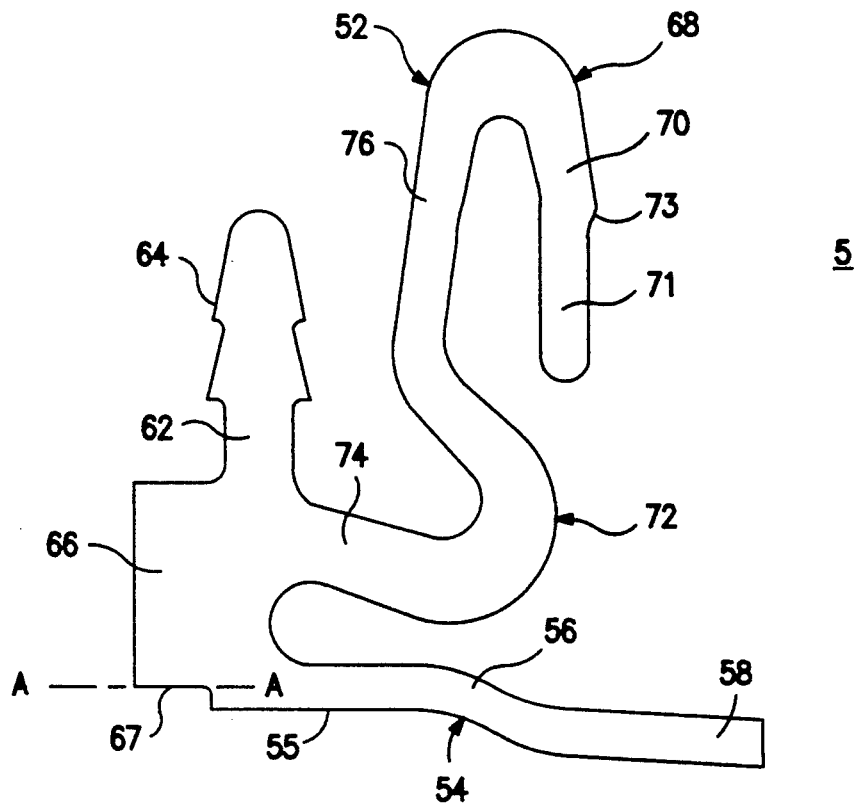
FIG. 2 is a side view of a contact used in the socket of FIG. 1.
Figure 4A:
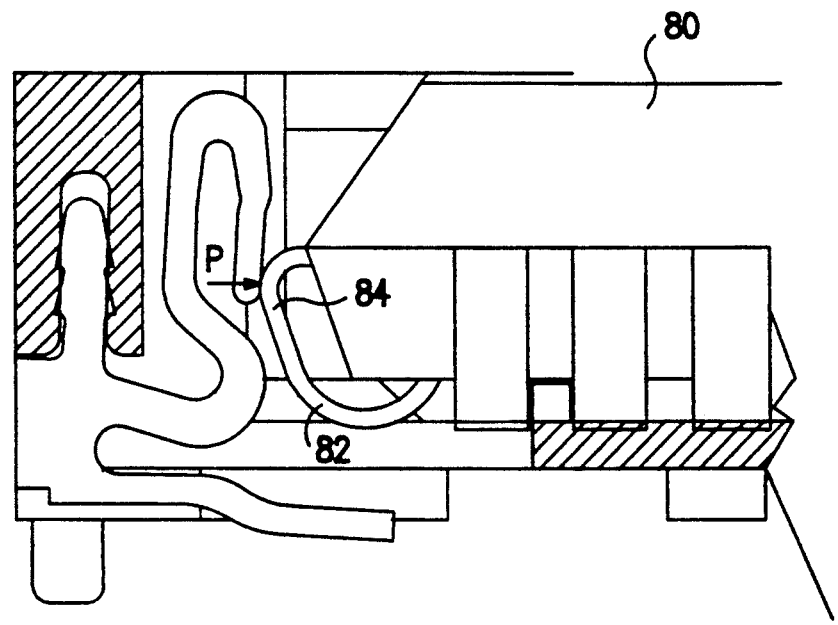
FIG. 4(A) is a view of the chip carrier socket of FIG. 3 to depict the insertion of a thinner chip carrier.
Figure 4B:
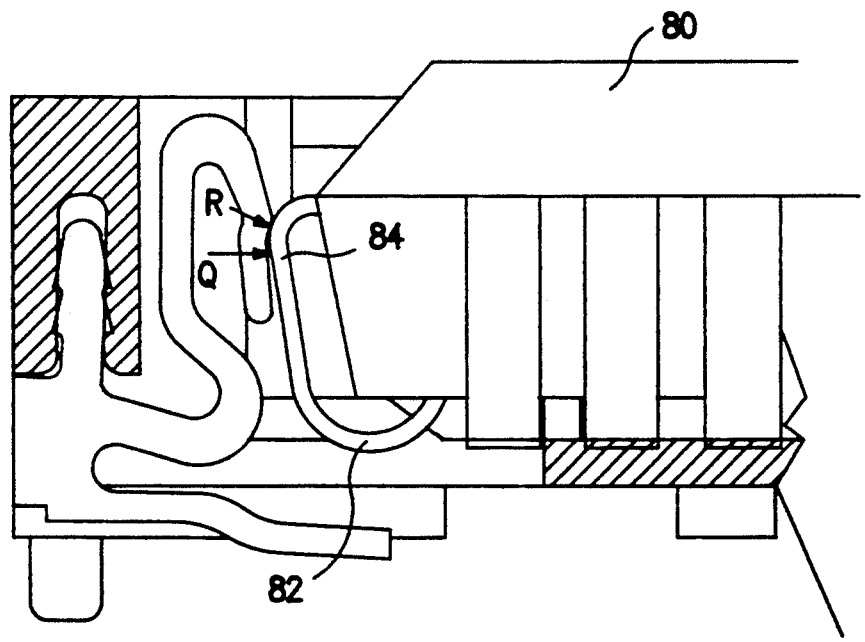
FIG. 4(B) is a view of the chip carrier socket of FIG. 3 to depict the insertion of a thicker chip carrier.

Referring to FIG. 2, each flat contact 5 includes a generally S-shaped contacting section 52 which, also referring to FIGS. 4(A) & 4(B), cooperates with the corresponding lead of the chip carrier. A mounting section 54 positioned below the contacting section 52, cooperates with a circuit board (not shown) on which the socket is seated. The mounting section 54 has a downward oblique section 56 functioning as an offset to have the free end 58 of the mounting section 54 be coplanary with the below circuit board. It can be understood that if there is no oblique section 56 acting as a transition portion and the bottom surface of the mounting section 54 is designed to be a straight line type, the coplanarity arrangement of mounting sections of all the contacts is an uneasy work for manufacturing or assembling. The oblique section 56 can offer a resilient character for the free end 58 of the mounting section 54 to accommodate coplanarity of contacts in SMT process so it allows a broader variation of the positions of the mounting sections regardless of due to assembling or manufacturing process.

A retention section 62 extends upward from an outer fixed end 60 of the mounting section 54 for fastening the contact 52 to the socket 2. There are two pairs of opposite barbs 64 on the retention section 62 for making an interference fit with the socket 2.

A reference section 66 laterally extends outward from the lower portion of the retention section 62 to the outer surface 32. The reference section 66 functions as both a stopper during assembling and a testing portion during using a probe to check the status of the contacts after the socket has been mounted on the circuit board. The details will be described later.

The S-shaped contacting section 52 comprises a generally vertical upside-down U-shaped upper portion 68 of which an inner leg 70 engages the corresponding lead 82 of the chip carrier 80 (shown in FIGS. 4(A), 4(B), and 5(A)–5(C)), and a lying generally V-shaped lower portion 72 of which an lower leg 74 is connected to the lower portion of the retention section 62. The U-shaped upper portion 68 and the V-shaped lower portion 72 are connected through the outer leg 76 of the U-shaped upper portion 68 and the upper leg 78 of the V-shaped portion 72 to define the whole S-shaped contacting section 52. The inner leg 70 has a thinner free end portion 71 inward extending obliquely so a ramp 73 is formed on the outward facing outline of the inner leg 70. This ramp 73 is much more important when the inner leg 70 engages the lead of a thicker chip carrier, as will be described later.

It can be noted that the width of V-shaped portion 72 is obviously larger than that of U-shaped upper portion 68. This specific design provides the contacting section 52 with more flexibility but still strong enough to accommodate a larger scope of variation of the corresponding chip carrier. This feature and advantage is more important when applied in a low profile socket. The different situations resulting from the different thickness chip carriers will be illustrated later in FIGS. 4(A) and 4(B).

Referring back to FIG. 2, because the contact 5 is connected to the strip (not shown) along line A—A and near the bottom surface 67 of the reference section 66 which is offset to the bottom surface 55 of the mounting section 54 so that the burr due to the breaking will not protrude beyond the bottom surface 55 of the mounting section 54 to mislead the insertion of the contact.

Figure 3:
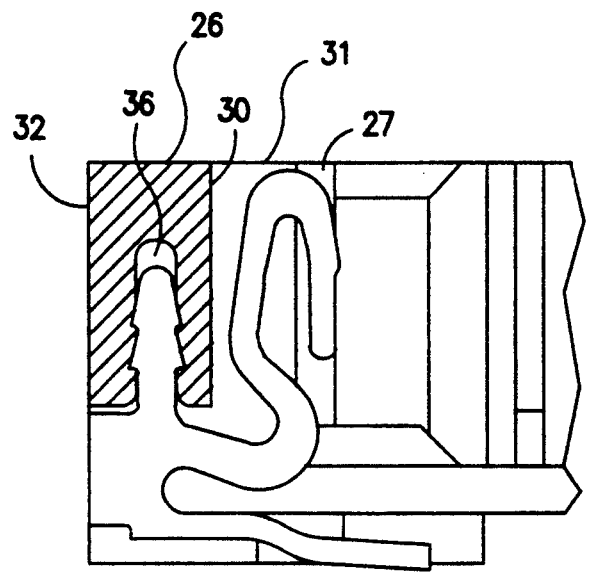
FIG. 3 is a fractional cross sectional view of the chip carrier socket of FIG. 1 having the contacts therein showing the contacts prior to the insertion of the chip carrier.

Referring to FIG. 3, a top-closed openings 36 is laterally positioned beside each slot 34 to receive the corresponding retention section 62 therein. The barbs 64 make an interference fit within the openings 36.

Also referring back to FIG. 1, on the bottom the socket 2 has four standoffs 29 at four corners that is seated on the board. This is also the reason why mounting section 54 of the contact 5 has a downward oblique section 56 to offset the free end 58 in order to be coplanary with the standoffs 29 for engagement with the board. Two posts 25 may be positioned on two standoffs 29 for extending into the corresponding holes in the board (not shown) for mounting.

Figure 5A:
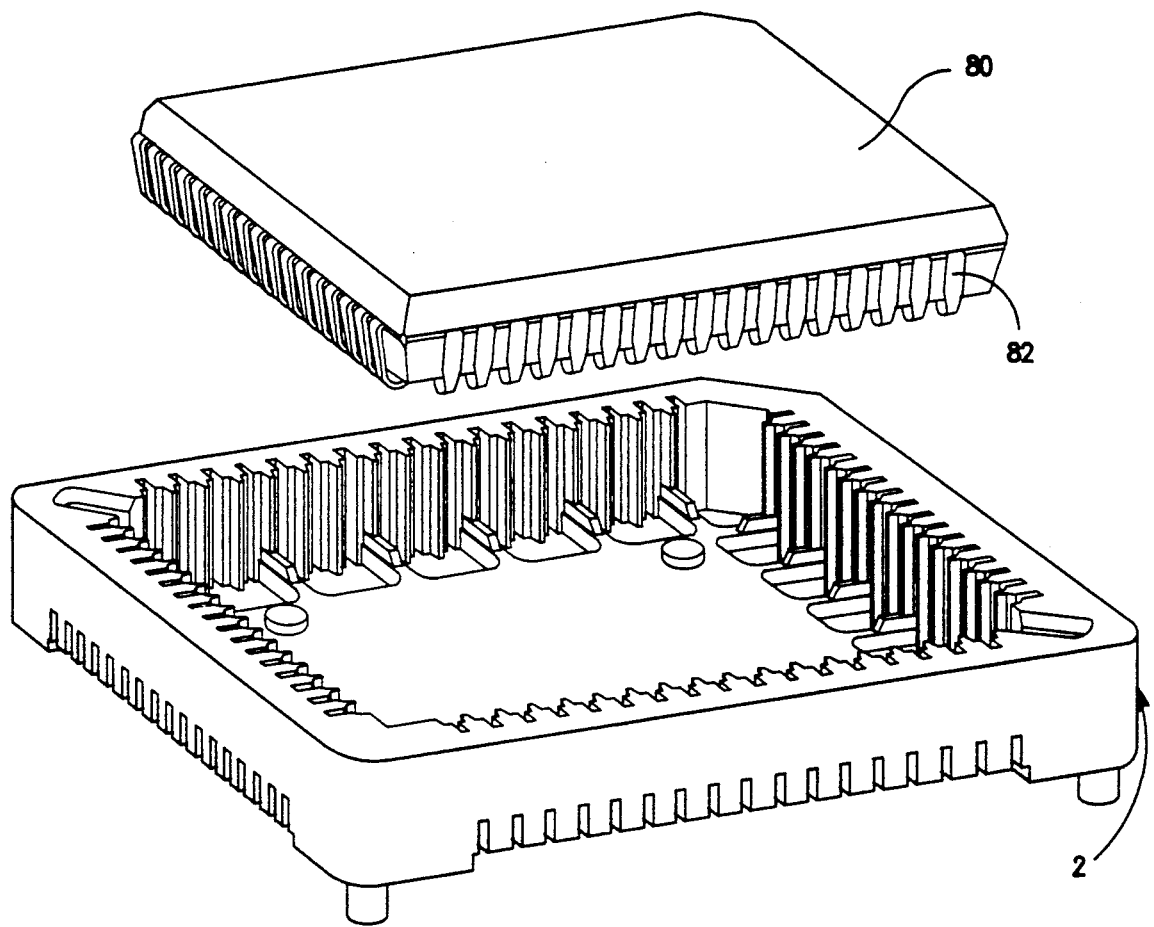
FIGS. 5(A)–5(C) are perspective views to show the procedure by which the chip carrier is received within the socket of FIG. 1.
Figure 5B:
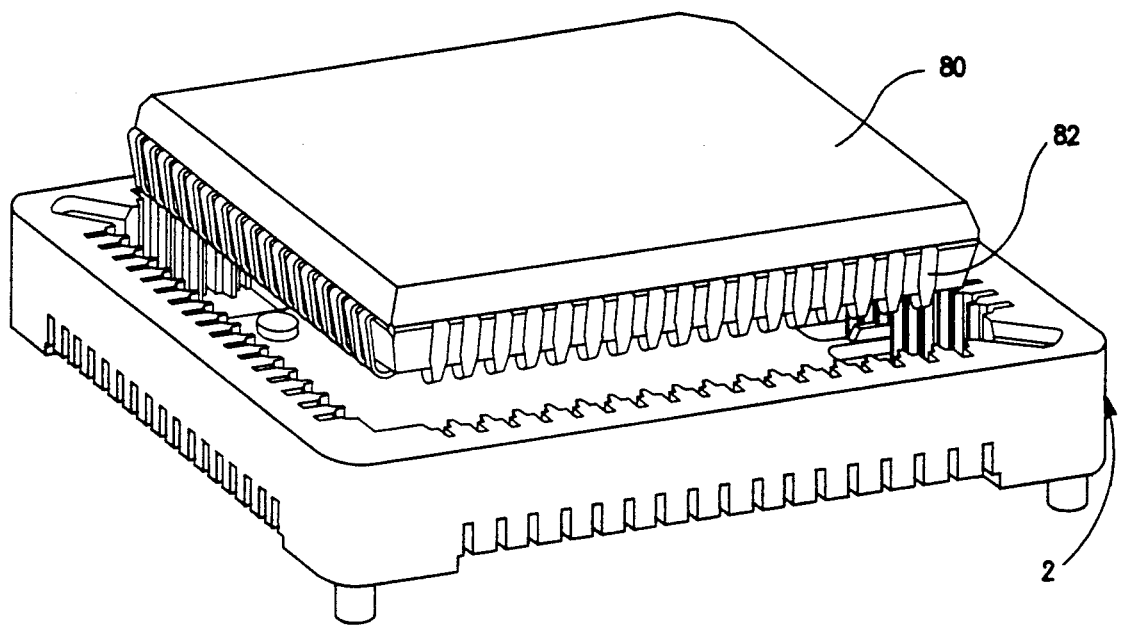
Figure 5C:
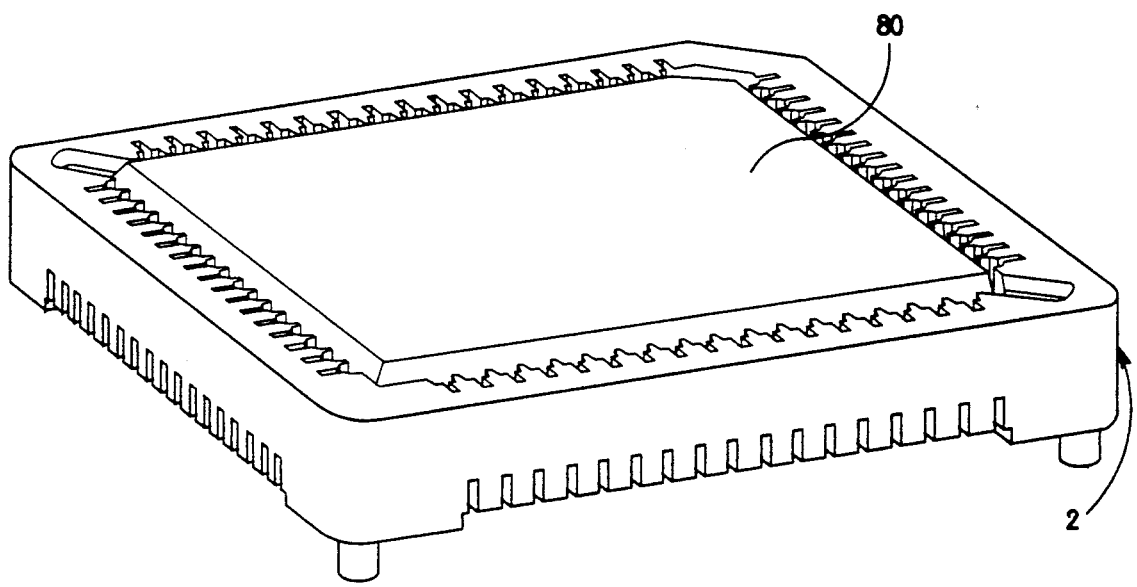

A rib 27 extending through the top surface 26 and the bottom surface 28, is positioned on each partition 31 to separate every lead 82 of the carrier chip 80 (also referring to FIGS. 5(A)-5(C)). So, a trapezoidal channel 23 is formed by every two adjacent ribs 27 and the partition surfaces therebetween to receive each lead 82 of the carrier chip 80 and the inner leg 70 of the contacting section 52 therein. A plurality of parallel inward extending standoffs 33 are positioned along each wall 24 to incorporate with four standoffs 21 positioned on the base 22 for supporting the bottom of the chip carrier 80. It can be understood that under some situations, the base 22 and its associated standoffs 21 can be removed from the socket 2 for the customer's requirement due to testing or heat sink consideration. In those conditions, the chip carrier 80 is only supported by standoffs 33 beside the walls 24. Two diagonally opposite grooves 35 are positioned at two corners for receiving an extraction tool for insertion or withdrawal of the chip carrier.

FIGS. 5(A)-5(C) show a procedure during insertion of the chip carrier 80 into the recess 20 of the socket 2. Turning to FIG. 4(A), a thinner chip carrier 80 is positioned within the socket 2 wherein the lead 82 of the chip carrier 80 engages the free end 71 of the inner leg 70 and the inner leg 70 exerts an inward and downward force in a direction as shown by arrow P. It assures the chip carrier 80 does not easily jump out of the recess 20 of the socket 2 due to vibration. When a thicker chip carrier 80 is positioned within the recess 20 of the socket 2, as shown in FIG. 4(B), the lead 82 of the chip carrier 80 engages around the ramp 73 of the inner leg 70. In this situation, the inner leg 70 exerts an inward and upward force in a direction as shown by arrow Q, the ramp 73 can also provide the lead 82 of the chip carrier 80 with a downward force in a direction as shown by arrow R. This ramp 73 and the exerted force R will not allow easy upward movement of the chip carrier 80 and assure that the chip carrier 80 is positioned within the recess 20 of the socket 2 properly.

Obviously in brief, although the inner leg 70 exerts the forces in different directions by the range between arrows P and Q as shown in FIGS. 4(A) and 4(B) when incorporated with different thickness chip carriers 80, it always has a good retention effect under the condition that the lead contacting section 84 of different thickness chip carrier 80 is positioned in a range between the ramp 73 and the free end 71 of the inner leg 70.

As aforementioned, in the present invention the stamped S-shaped contacting section 52 cooperating with the wider lower V-shaped portion 72 and the thinner free end portion 71 of the upper U-shaped portion 70 allows of two requirements regarding a low profile contact design and still owns a sufficient retention force to engage the lead 82 of the chip carrier 80. Based on this specific structure to satisfy foregoing two requirements, i.e. SMT and low profile, the retention force changes from in a downward direction when a thinner chip carrier 80 is positioned within the socket 2, to in an upward direction when a thicker chip carrier 80 is positioned within the socket 2. In the latter situation the ramp 73 also provides a downward force and an obstacle for preventing the further upward movement of the chip carrier 80. The alteration of the retention force direction to fit for different thickness chip carrier is a feature of the present invention due to the specific configuration of the S-shaped contacting section 52 which is defined by the U-shaped upper portion 68 and the V-shaped lower portion 72 in combination.

Different from some other prior arts as disclosed in U.S. Pat. Nos. 4,645,279, 4,630,875, 4,941,832, the retention section 62 is embedded within the top-closed opening 36 that will allow of a more stable retention against any outside influence.

It can be noted that the lower portion of the retention section 62 is integrated with the reference section 66 to form a large and strong structure to support the S-shaped contacting section 52. In accordance with the whole structure of the contact 5, the force resulting from engagement of the contacting section 52 of the contact 5 and the lead contacting section 84 of the lead 82, some is dispersed by reference section 62, and thus less stress is transferred therefrom to the retention section 62 or to the mounting section 54. This assures that the securement between the contact 5 and the socket 2 and between the contact 5 and the below board, endures the minimum transferred stress due to insertion of the chip carrier 80, and is not easy to fail.

It is also seen that the reference section 66 may not only communicate with the outside for easy access by a probe, but also feature a stopper to abut against the socket if necessary when the contact 5 is inserted into slot 34 of the socket 2.

While the invention has been described in connection with what is presently considered to be the most practical and preferred embodiment, it is to be understood that the invention is not limited to the disclosed embodiment but, on the contrary, is intended to cover various modifications and equivalent arrangements included within the spirit and the scope of the appended claims.

Therefore, persons of ordinary skill in this field are to understand that all such equivalent structures ar to be included within the scope of the following claims:

What is claimed is:

1. An IC socket for use with an integrated circuit chip carrier having a plurality of spaced apart contact leads extending therefrom, said IC socket including:
   a recess for reception of the chip carrier therein;
   contact receiving slots positioned in surrounding relationship to the recess and having contacts disposed therein; and
   each said contact having a generally S-shaped contacting section cooperating with the corresponding lead of the chip carrier, a mounting section cooperating with a circuit board on which the socket is seated, a retention section extending upward from an outer end of the mounting section for fastening the contact to the socket, and a reference section laterally extending outward from the retention section for acting as a stopper for positioning of the contact or as a testing portion for easy access by a probe, wherein the S-shaped contacting section of the contact includes a generally vertical upside-down U-shaped upper portion of which an inner leg engages the lead of the chip carrier, and a lying generally V-shaped lower portion of which an lower leg is connected to the retention section.

2. The socket as described in claim 1, wherein the U-shaped portion of the contact further includes an outer leg and the V-shaped portion of the contact further includes an upper leg whereby the outer leg of the U-shaped portion and the upper leg of the V-shaped portion are connected to each other and said generally S-shaped portion are defined by both said U-shaped portion and said V-shaped portion.

3. The socket as described in claim 1, wherein the retention section of each contact is received within a corresponding top-closed opening of the socket and has at least one pair of opposite barbs thereon to engage said opening.

4. The socket as described in claim 1, wherein the mounting section of the contact extending inward toward the recess includes a downward oblique section to provide a free end of said mounting section with a resilient character.

5. The socket as described in claim 1, wherein a ramp is positioned on the inner leg of the contacting section of the contact to prevent an upward movement of a thicker chip carrier inserted in the recess of the socket.

6. The socket as described in claim 1, wherein the socket comprises a square base having walls circumferentially extending normally therefrom, each wall defining a top surface, a bottom surface, an inner surface and an outer surface, a plurality of partitions extending between and through the top surface and the bottom surface and positioned on the inner surface, said slot formed among every two adjacent partitions and the inner surface therebetween, a rib extending between the top surface and the bottom surface and positioned on each partition for separating every lead of the carrier chip received within the recess, whereby a trapezoidal channel is formed by every two adjacent ribs and surfaces of partitions therebetween to receive one said lead of the carrier chip and one inner leg of the contacting section of the contact therein.

7. The socket as described in claim 1, wherein a plurality of parallel inwardly extending standoffs are positioned along each wall for supporting the chip carrier thereon.

8. A contact for a chip carrier socket including:
   a generally S-shaped contacting section for cooperating with a lead of a chip carrier;
   a horizontal mounting section for cooperation with a circuit board on which the chip carrier socket is seated;
   a vertical retention section extending upward from an outer end of the mounting section for fastening the contact to the socket; and
   said S-shaped contacting section being defined by a generally vertical upside-down upper U-shaped portion and a lying generally V-shaped lower portion.

9. The contact as described in claim 8, wherein the contact further comprises a reference section extending laterally from the retention section for functioning both as a stopper and as a testing portion.

10. The contact as described in claim 8, wherein the mounting section has a downward oblique section to provide a free end of the said mounting section with a resilient character.

11. The contact as described in claim 8, wherein at least one pair of barbs are oppositely positioned on the retention section.

12. The contact as described in claim 8, wherein sad contact is only formed by stamping.

13. The contact as described in claim 8, wherein the U-shaped portion includes an inner leg an outer leg, and the V-shaped portion includes a lower leg and an upper leg, whereby the inner leg of the U-shaped portion is for engagement with the lead of the chip carrier, the lower leg of the V-shaped portion is connected to the retention section of the contact, and the outer leg of the U-shaped portion and the upper leg of the V-shaped portion are integrally connected to each other.

14. The contact as described in claim 13, wherein the inner leg has a ramp thereon for cooperation with different thickness chip carriers, and retention force resulting from said contact alters directions when different thickness chip carriers engage therewith.

15. The contact as described in claim 10, wherein said lower V-shaped portion is wider than said upper U-shaped portion.

16. A socket for use with an integrated circuit chip carrier having a plurality of spaced apart contact leads extending therefrom, said socket including:
   a central recess for reception of the chip carrier therein;
   walls circumferentially extending upward from the recess, each wall defining a top surface, a bottom surface, an inner surface and an outer surface, a plurality of side by side slots positioned along each wall for reception of the corresponding contacts therein, each slot extending between and through the top surface and the bottom surface, and through a portion of the outer surface, a plurality of parallel standoffs laterally extending inward for supporting the chip carrier; and
   a plurality of contacts for engagement with the leads of the chip carrier, each contact received within the corresponding slot and including a generally S-shaped contacting section defined by both a generally vertical upside-down upper U-shaped portion and a lying generally V-shaped lower portion, a horizontal mounting section for cooperation with a circuit board on which the socket is seated, and a vertical retention section extending upward from a fixed end of the mounting section.

17. The socket as described in claim 16, wherein the contact further includes a ramp on the S-shaped contacting section and a reference section laterally extending from a lower portion of the retention section.

* * * * *